(12) United States Patent
Davis et al.

(10) Patent No.: US 7,086,028 B1
(45) Date of Patent: Aug. 1, 2006

(54) SIMPLIFIED GENERATION OF DESIGN CHANGE INFORMATION ON A DRAWING IN A COMPUTER AIDED DESIGN (CAD) ENVIRONMENT

(75) Inventors: Kenneth L. Davis, San Diego, CA (US); Roger F. Klemm, San Diego, CA (US)

(73) Assignee: Autodesk, Inc., San Rafael, CA (US)

( * ) Notice: Subject to any disclaimer, the term of this patent is extended or adjusted under 35 U.S.C. 154(b) by 362 days.

(21) Appl. No.: 10/410,863

(22) Filed: Apr. 9, 2003

(51) Int. Cl.
*G06F 17/50* (2006.01)
*G06F 3/048* (2006.01)
*G09G 5/00* (2006.01)

(52) U.S. Cl. .............................. 716/11; 716/9; 716/10; 703/1; 703/2; 345/636; 345/689; 345/582; 345/619; 345/629; 715/502; 715/511; 715/512; 715/751; 715/764; 700/97

(58) Field of Classification Search ................. 716/11, 716/9, 10; 703/1, 2; 345/420, 581, 661, 345/522, 689, 582, 619, 629, 636; 700/98, 700/97; 715/502, 511, 512, 751, 764
See application file for complete search history.

(56) References Cited

U.S. PATENT DOCUMENTS

| | | | | |
|---|---|---|---|---|
| 5,220,512 A * | 6/1993 | Watkins et al. | ................ | 716/11 |
| 5,454,073 A * | 9/1995 | Fukushima et al. | ......... | 715/807 |
| 5,596,691 A * | 1/1997 | Good et al. | ................. | 345/440 |
| 5,689,711 A * | 11/1997 | Bardasz et al. | ............. | 717/105 |
| 5,721,959 A * | 2/1998 | Nakamura et al. | ............. | 716/11 |
| 5,732,264 A * | 3/1998 | Tanaka | ........................... | 707/4 |
| 5,740,341 A * | 4/1998 | Oota et al. | ................... | 345/420 |
| 5,745,686 A * | 4/1998 | Saito et al. | ................... | 717/168 |
| 5,806,078 A * | 9/1998 | Hug et al. | ................... | 715/511 |
| 5,844,563 A * | 12/1998 | Harada et al. | .............. | 345/420 |
| 5,845,299 A * | 12/1998 | Arora et al. | ................. | 715/513 |
| 5,867,399 A * | 2/1999 | Rostoker et al. | .............. | 716/18 |
| 5,953,693 A * | 9/1999 | Sakiyama et al. | .............. | 704/3 |
| 6,233,351 B1 * | 5/2001 | Feeney et al. | ................ | 382/155 |
| 6,285,369 B1 * | 9/2001 | Kross et al. | ................. | 345/419 |
| 6,466,953 B1 * | 10/2002 | Bonney et al. | ............. | 715/502 |
| 6,614,430 B1 * | 9/2003 | Rappoport | ................... | 345/420 |
| 6,629,065 B1 * | 9/2003 | Gadh et al. | ..................... | 703/1 |
| 6,646,642 B1 * | 11/2003 | Kanetaka et al. | ........... | 345/473 |

(Continued)

FOREIGN PATENT DOCUMENTS

JP              62001073 A   *   1/1987

(Continued)

OTHER PUBLICATIONS

NA9306533, "Online Publication Editing System", IBM Technical Disclosure Bulletin, vol. 36, No. 6A, Jun. 1993, pp. 533-538 (7 pages).*

(Continued)

*Primary Examiner*—Phallaka Kik
(74) *Attorney, Agent, or Firm*—Fish & Richardson P.C.

(57) ABSTRACT

The invention includes computer instructions that operate to receive an indication of a modification of a design, the design being displayed as part of a drawing within a computer aided design (CAD) environment. Responsive to the received indication, the computer instructions operate to automatically generate and display design change information of the design on the drawing, based at least in part on the received indication. As a result, design change information is advantageously automatically generated and displayed responsive to receiving an indication of a modification in design facilitating simplified conveying and tracking of design change information on a drawing within a CAD environment.

29 Claims, 5 Drawing Sheets

U.S. PATENT DOCUMENTS

| | | | |
|---|---|---|---|
| 6,647,305 B1* | 11/2003 | Bigelow | 700/97 |
| 6,801,229 B1* | 10/2004 | Tinkler | 715/853 |
| 6,856,846 B1* | 2/2005 | Fuki et al. | 700/98 |
| 6,931,590 B1* | 8/2005 | Kanie et al. | 715/511 |
| 6,950,984 B1* | 9/2005 | Hori et al. | 715/513 |
| 6,993,710 B1* | 1/2006 | Coad et al. | 715/511 |
| 7,000,196 B1* | 2/2006 | Kobayashi | 715/810 |
| 2001/0018696 A1* | 8/2001 | Hori et al. | 707/513 |
| 2002/0012007 A1* | 1/2002 | Twigg | 345/677 |
| 2002/0042904 A1* | 4/2002 | Ito et al. | 716/8 |
| 2003/0014139 A1* | 1/2003 | Yokomori et al. | 700/96 |
| 2003/0055521 A1* | 3/2003 | Fuki et al. | 700/98 |
| 2003/0085889 A1* | 5/2003 | Chin et al. | 345/419 |
| 2003/0097642 A1* | 5/2003 | Arai et al. | 716/1 |
| 2003/0221172 A1* | 11/2003 | Brathwaite et al. | 716/1 |
| 2004/0133549 A1* | 7/2004 | Stevens et al. | 707/1 |
| 2004/0153988 A1* | 8/2004 | Ito et al. | 716/11 |
| 2004/0196310 A1* | 10/2004 | Aamodt et al. | 345/738 |
| 2004/0205600 A1* | 10/2004 | Kakuta et al. | 715/516 |
| 2004/0225988 A1* | 11/2004 | Petunin et al. | 716/11 |
| 2005/0010880 A1* | 1/2005 | Schubert et al. | 716/4 |
| 2005/0212797 A1* | 9/2005 | Lee et al. | 345/419 |
| 2005/0257136 A1* | 11/2005 | Charisius et al. | 715/511 |
| 2005/0278670 A1* | 12/2005 | Brooks et al. | 716/5 |

FOREIGN PATENT DOCUMENTS

| | | | |
|---|---|---|---|
| JP | 07200660 A | * | 8/1995 |
| JP | 2000067222 A | * | 3/2000 |
| JP | 2001243487 A | * | 9/2001 |
| KR | 2003006451 A | * | 1/2003 |

OTHER PUBLICATIONS

Card et al., "Advanced Analysis of Dynamic Neural Control Advisories for Process Optimization and Parts Maintenance", IEEEI/SEMI Adavnced Semiconductor Manufacturing Conference and Workshop, Mar. 31, 2003, pp. 315-321.*

Shih et al., "Asynchronous Multimedia Presentation Design Machine", Proceedings of the Twelfth International Conference on Information Networking Jan. 21, 1998, pp. 718-721.*

Lim et al., "An Automated Change-Detection Algorithm for HTML Documents based on Semantic Hierarchies", Proceedings of 17th International Conference on Data Engineering, Apr. 2, 2001, pp. 303-312.*

Kim et al., "Collaboration between Writer and Reviewer Through Change Representation Tools", Proceedings of the 35th Annual Hawaii International Conference on Systems Sciences, Jan. 7, 2002, pp. 531-540.*

* cited by examiner

SIMPLIFIED GENERATION OF DESIGN CHANGE INFORMATION ON A DRAWING IN A COMPUTER AIDED DESIGN (CAD) ENVIRONMENT

FIELD OF INVENTION

The invention relates to the field of computer aided design (CAD). More specifically, the invention relates to simplified generation of design change information on a drawing in the CAD environment.

BACKGROUND OF THE INVENTION

An important aspect of engineering is tracking changes to a design, and being able to convey the changes to subsequent designers. For example, in a computer aided design (CAD) environment, a designer may convey information regarding a particular design by having various views of the design on a drawing e.g., orthographic projection. Often times, the views may have various information regarding the design. For example, the views on the drawing may have dimensional information such as geometric dimensioning and tolerancing (GD&T). Accordingly, changes to the design may require changes to the information regarding the design (i.e., changes to design may affect various dimensions and/or various other annotations in the drawing). In order to track these changes to the design, often times, the designer may be required to perform tedious updating of information on the drawing.

For example, a drawing may commonly have revision information in the form of a block to provide various information regarding the design, and in particular, as it relates to modifications of the design. The revision block may include information such as, but not limited to, an identifier associated with the affected part of the design, a location of the identifier on the drawing, a revision number of the drawing, description of the modification, a date of the revision and/or modification, and initials of a user (i.e., the designer) that performed the modifications. Accordingly, in order to provide appropriate design history, each time a design is modified, a user may be required to provide numerous information for the revision block manually, which may be tedious and difficult.

BRIEF DESCRIPTION OF DRAWINGS

The invention will be described by way of exemplary embodiments, but not limitations, illustrated in the accompanying drawings in which like references denote similar elements, and in which.

DETAILED DESCRIPTION OF THE EMBODIMENTS

Figure 1:
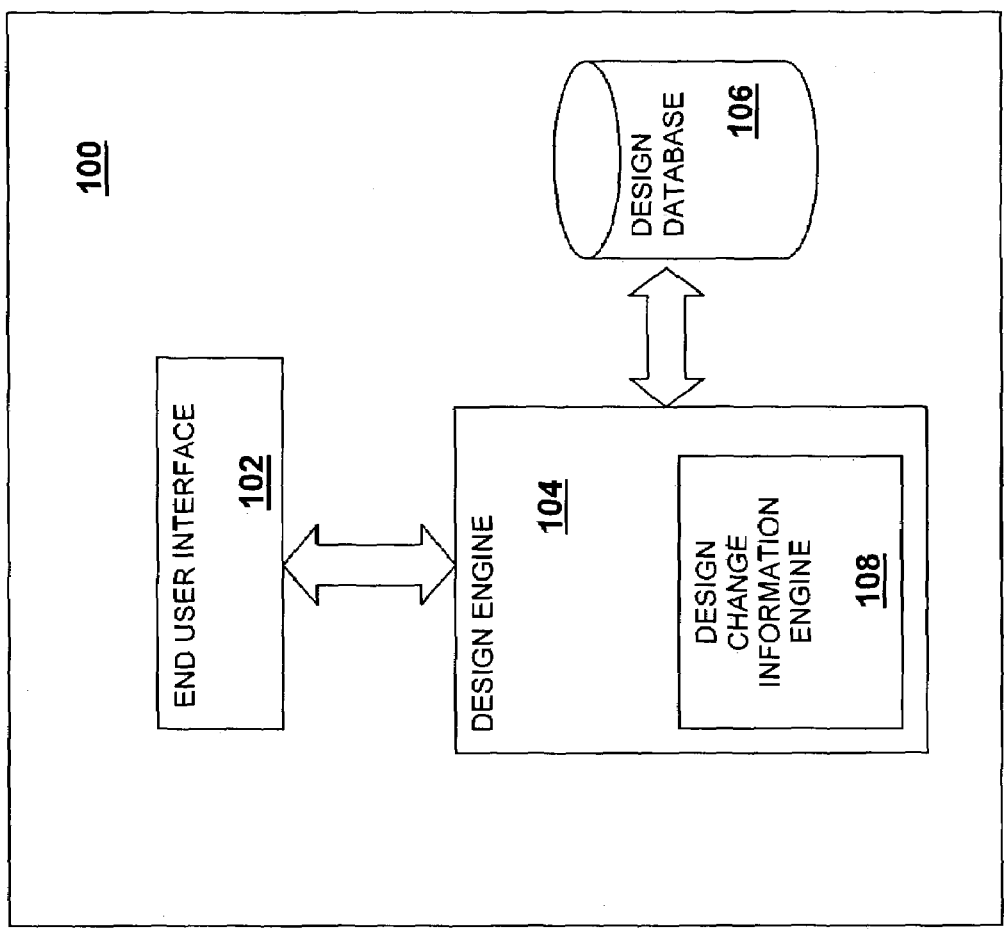
FIG. 1 illustrates a block diagram of one embodiment of a mechanical design application for facilitating simplified generation of design change information on a drawing within a CAD environment, in accordance with one embodiment of the invention.

In the following description, various embodiments of the invention will be described. However, it will be apparent to those skilled in the art that the embodiments may be practiced with only some or all aspects of the invention. For purposes of explanation, specific numbers, materials and configurations are set forth in order to provide a thorough understanding of the embodiments. However, it will also be apparent to one skilled in the art that the embodiments may be practiced without the specific details. In other instances, well known features are omitted or simplified in order not to obscure the invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system includes general purpose as well as special purpose data processing machines, systems, and the like, that are standalone, adjunct or embedded.

Various operations will be described as multiple discrete operations in turn, in a manner that is most helpful in understanding the invention, however, the order of description should not be construed as to imply that these operations are necessarily order dependent. In particular, these operations need not be performed in the order of presentation.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments.

For the purposes of describing the embodiments of the invention, in a computer aided design (CAD) environment, references to a CAD entity may denote graphically displayed images on a user interface. Additionally, a design may be a CAD geometry piece, which in turn, may be a 2-D geometry piece such as, but not limited to, a line, arc, point, and so forth. Alternatively, a design may be a 3-D geometry piece and/or an assembly of 3-D geometry pieces, having solid properties such as, but not limited to, volume, weight, and density, hereon out referred to as a design. Accordingly, a design may include any type of CAD entity such as, but not limited to, text, dimensions, tolerances, geometric feature notes, geometric feature tables, and so forth. Additionally, various views may be utilized to aid in representing designs such as, but not limited to, orthographic views, projected views, details views, sections views, and so forth.

In various embodiments of the invention, simplified generation of design change information on a drawing is facilitated. This and other advantages will be evident from the disclosure.

FIG. 1 illustrates a block diagram of one embodiment of a mechanical design application for facilitating simplified generation of design change information on a drawing within a CAD environment, in accordance with one embodiment of the invention. In FIG. 1, mechanical design application 100 includes an end user interface 102, a design engine 104, and a design database 106. The design engine 104 includes, in particular, design change information engine 108, in accordance with one embodiment of the invention. Together, the elements cooperate to automatically generate and display design change information on a drawing, in accordance with one embodiment of the invention.

In FIG. 1, the end user interface 102 operates to graphically display and receive various inputs corresponding to a design. Moreover, the design may be displayed as part of a drawing within the CAD environment. Under the control of the design engine 104, the design database 106 operates to store information regarding the design including information such as drawing information.

Once information regarding the design has been stored, and upon receiving an indication of a modification of the design, the design change information engine 108 automatically utilizes various data to automatically generate and display design change information on the drawing, based at least in part on the received indication.

Except for the teachings of the invention incorporated in the design change information engine 108, mechanical design application 100 is intended to represent a broad range of CAD software known in the art, including but not limited to Autodesk Inventor®, available from Autodesk, Inc. of San Rafael, Calif.

Figure 2:
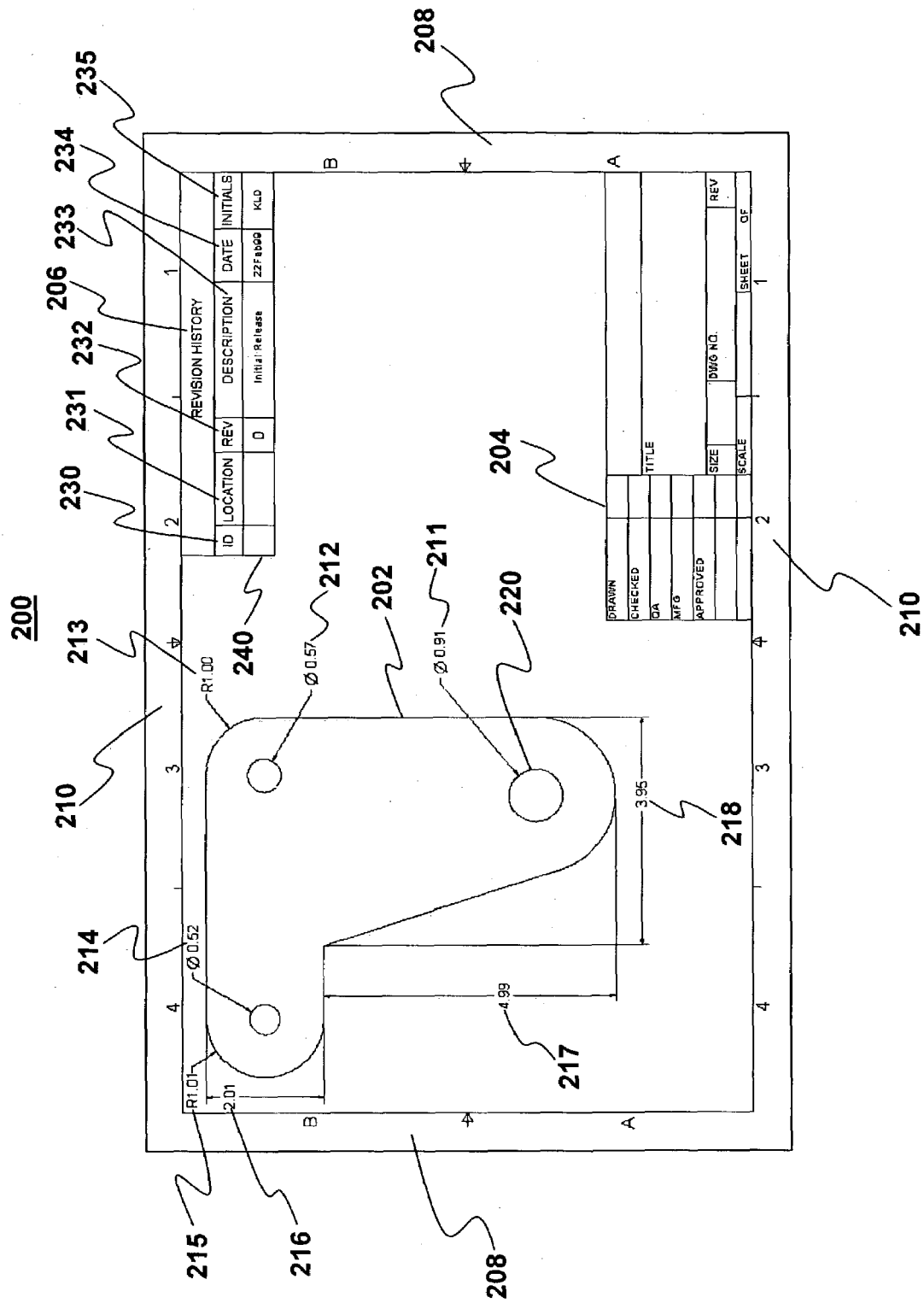
FIG. 2 illustrates an exemplary design being displayed as part of a drawing within a CAD environment with which various embodiments of the invention may be practiced.

FIG. 2 illustrates an exemplary design being displayed as part of a drawing within a CAD environment with which various embodiments of the invention may be practiced. Shown in FIG. 2 is a drawing 200 having a design 202, a drawing information block 204, a revision history block 206, a vertical location system 208, and a horizontal location system 210. Additionally, shown in FIG. 2 are a number of informational CAD entities 211–218 in the form of dimensions associated with the design 202. Informational CAD entities 211–218 are shown for example, and accordingly, may be any type of informational CAD entities such as, but not limited to, textual information. However, for the purposes of describing the invention, the informational CAD entities 211–218 are illustrated as dimensions, hereon out referred to as dimensions.

Dimensions 211–218 may provide dimensional information for the design 202 such as dimensional information associated with various features. For example, illustrated in FIG. 2, design 202 may have dimension 211 associated with feature 220, where feature 220 may be a hole type feature. Accordingly, dimension 211 may define a diameter of feature 220, and may be parametrically associated with the feature 220. That is, dimension 211 may parametrically update with modifications to the feature 220.

Illustrated in FIG. 2, revision history block 206 may include various fields for design change information such as an identifier field 230, location of identifier field 231, revision number field 232, description of modification field 233, date of modification field 234, and identification of user field 235. As shown in FIG. 2, revision history block 206 includes a row 240 having the description of modification field 233 as "Initial Release", which may designate that the design 202 has been initially released, and accordingly, has not yet been modified. Correspondingly, the identifier and location of identifier fields 230 & 231 may be left blank. However, the revision number, date, and identification of user fields 232, 234–235 may include information such as a revision number of "0" that may correspond to an initial release, a date that may correspond to date of the initial release, and user initials that may correspond to initial user (i.e., designer).

As will be described in detail, modifications to the design 202 advantageously results in the design change information engine 108 (shown in FIG. 1) automatically generating and displaying design change information on the drawing 200. That is, for example, responsive to receiving an indication of a modification to the feature 220, design change information engine 108 automatically generates and displays design change information in the revision history block 206.

The vertical location system 208, and the horizontal location system 210 facilitates determination of locations of the various CAD entities on the drawing. For example, dimension 211 may be located approximately in vertical location B and horizontal location 2, and accordingly, the location of dimension 211 may be determined as being B2. As previously alluded to, the design information such as locations of the various CAD entities on the drawing may be stored in the design database 106 (shown in FIG. 1). The design change information engine 108 may utilize the stored information to facilitate automatic generation and display of design change information, in accordance with the teachings of the invention.

The drawing information block 204 may include various drawing information such as, but not limited to, title, scale, drawing number, and so forth. Additionally, for ease of understanding the embodiments of the invention, the drawing information block 204 and the revision history block 206 are shown as separate blocks. However, it should be appreciated that the drawing information block 204 and the revision history block 206 may be combined as a single block. Moreover, the drawing information block 204 and the revision history block 206 may be in any variety of forms to convey drawing information and revision history of a design, and need not necessarily be in block form.

It should be appreciated by those skilled in the relevant art that drawing 200 may include many more CAD entities than the ones shown because the drawing 200 may have numerous views, numerous designs, and numerous drawing sheets. However, for ease of understanding the embodiments of the invention, a limited number of drawing sheets, views, and designs will be utilized. Nevertheless, they sufficiently illustrate the invention. Additionally, drawing location systems 208 & 210 may be any type of location system for facilitating determination of a location of a CAD entity on a drawing and may be based at least in part on the size of the drawing.

Figure 3:
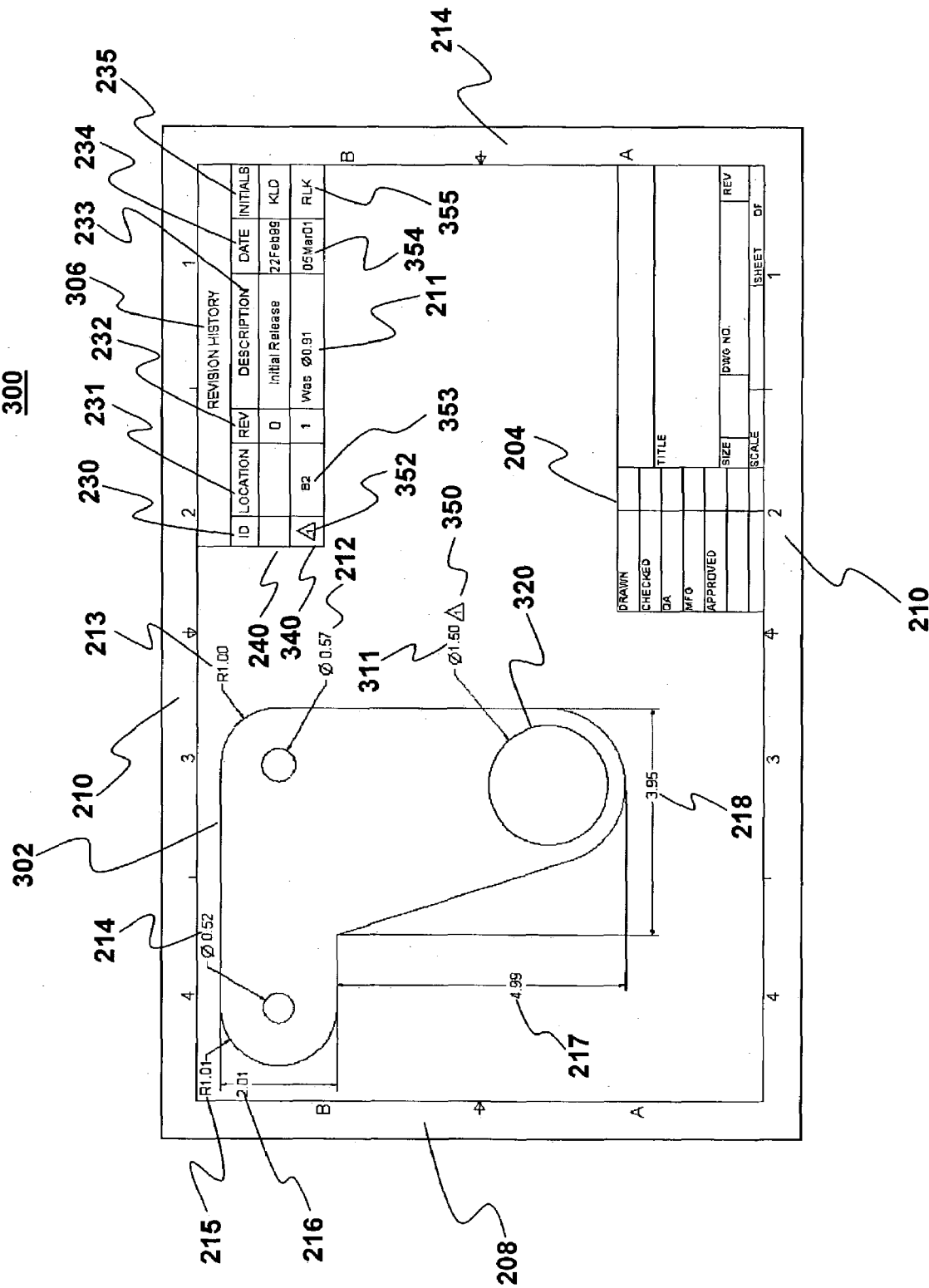
FIG. 3 illustrates automatic generation and display of design change information responsive to receiving an indication of a modification of a design, in accordance with one embodiment of the invention.

FIG. 3 illustrates automatic generation and display of design change information responsive to receiving an indication of a modification of a design, in accordance with one embodiment of the invention. Shown in FIG. 3 is a drawing 300 having a design 302 similar to the design 202 shown in FIG. 2. However, as shown, the design 302 has a feature 320 that is different from feature 220 shown in FIG. 2 (i.e., the feature 320 is a modified feature). For example, the diameter of feature 220 of FIG. 2 was modified to be a larger diameter. Accordingly, the dimension 211 (shown in FIG. 2) may be automatically updated to a modified dimension 311 as previously alluded to.

In one embodiment, the modification may be effectuated on the drawing 300. Alternatively, the modification may be effectuated in modeling, where the modification may be reflected on the drawing parametrically.

In accordance with the teachings of the invention, design change information engine 108 receives an indication of the modification to the design 202 that results in the modified design 302. Responsive to the received indication, the design change information engine 108 automatically generates and displays design change information on the drawing 300.

As illustrated, design change information in the form of an identifier 350 is automatically displayed and generated in proximity to the modified feature 320, and in particular, to dimension 311, in accordance with one embodiment. Additionally, design change information engine 108 automatically generates and displays design change information in the revision history block 206 (shown in FIG. 2) resulting in a modified revision history block 306.

Shown in FIG. 3, modified revision history block 306 includes a new row 340 having the automatically generated and displayed design change information, in accordance with one embodiment of the invention. That is, the identifier field 230 includes an identifier 352 corresponding to the identifier 350 in proximity to the modified dimension 311. The location of identifier field 231 includes a location 353 corresponding to the location of the identifier 350 in proximity to the modified dimension 311. The revision number field 232 includes a revision number of "1" corresponding to a first modification. The description of modification field 233 describes the previous dimension 211 (shown in FIG. 2) with accompanying textual information such as, but not limited to, "Was". The date of modification field 234, and the identification of user field 235 that made the modification has design change information 354–355.

As previously alluded to, the design change information may be generated and displayed on multiple sheets of one or more drawings within the CAD environment. Additionally, a design may have numerous modifications, and accordingly, the modified revision history block 306 may have numerous rows and identifiers that are automatically generated and displayed on the drawing based at least in part on the modification.

As a result, design change information is advantageously automatically generated and displayed responsive to receiving an indication of a modification in design facilitating simplified conveying and tracking of design change information on a drawing within a CAD environment.

Illustrated in FIG. 3, the identifiers 350 & 352 are substantially delta in shape. However, it should be appreciated by those skilled in the relevant art that the identifiers 350 & 352 may be in any shape such as, but not limited to, substantially circular.

As previously alluded to, the received indication of modification of a design may be in any form (i.e., any change to a CAD entity on the drawing). For example, a drawing may have textual information such as, but not limited to, a sentence describing machine finishing requirements. Accordingly, if the sentence is modified, the design change information engine 108 automatically generates and displays design change information on the drawing corresponding to the change as previously described.

Figure 4:
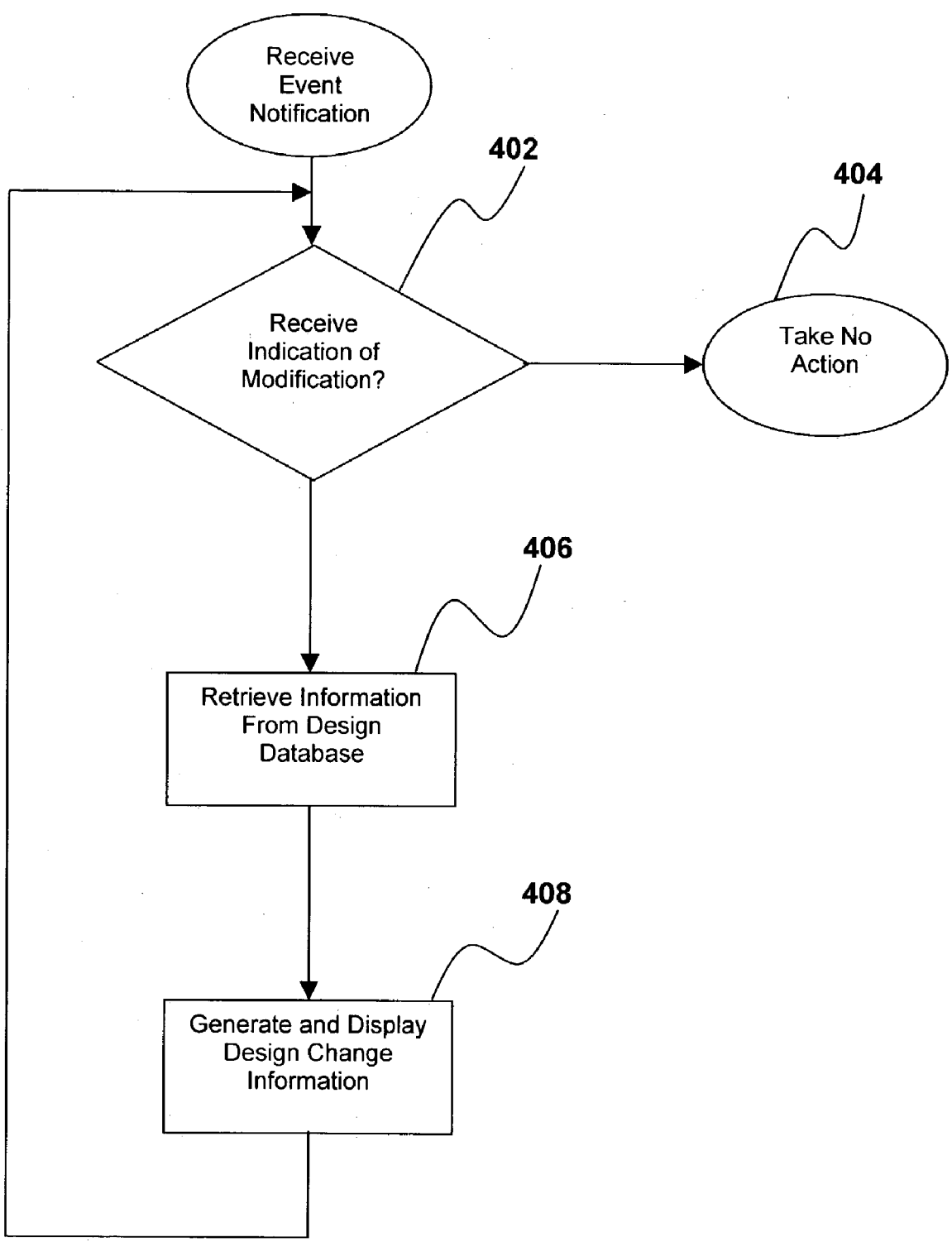
FIG. 4 illustrates the operational flow of some aspects of a design change information engine for generating and displaying design change information, in accordance with one embodiment of the invention.

FIG. 4 illustrates the operational flow of some aspects of design change information engine 108 of FIG. 1 for generating and displaying design change information, in accordance with one embodiment of the invention. For the illustrated embodiment, design change information engine 108 (shown in FIG. 1) may be programmed in accordance with an event driven model (i.e., design change information engine 108 may be executed in a system environment where various event notification services are available from the operating system). One example of such an operating system suitable for practicing the invention is the Windows® operating system, available from Microsoft Corporation of Redmond, Wash. In alternate embodiments, design change information engine 108 may be implemented in other programming approaches known in the art.

At operational block 402, the design change information engine 108 determines if an event notification is related to a modification of a design on a drawing. If it is determined that the received event notification is not related to a modification of a design on a drawing, the design change information engine 108 takes no action, operational block 404. However, if an event notification is related to a modification of a design on a drawing, the design change information engine 108 retrieves various information associated with the design from the design database 106 (shown in FIG. 1), operational block 406. Modifications may includes any type of change to various parts of the information stored in the design database 106 such as, but not limited to, text, views, etc. As previously described, some of the information that may be retrieved are location information to facilitate determination of the location of the modification, dimensional information before the modification, user information that may be logged in, date, and so forth. For example, the design database 106 may have information such as, but not limited to, the location of the affected CAD entity and information regarding any informational CAD entity associated with the affected CAD entity i.e., dimensions associated with features, etc.

Once various information from the design database 106 are retrieved, design change information engine 108 generates and displays design change information, operational block 408. As previously described, in one embodiment, the design change information may be generated and displayed within a revision history block.

As a result, automatic generation and displaying of design change information is facilitated.

Figure 5:
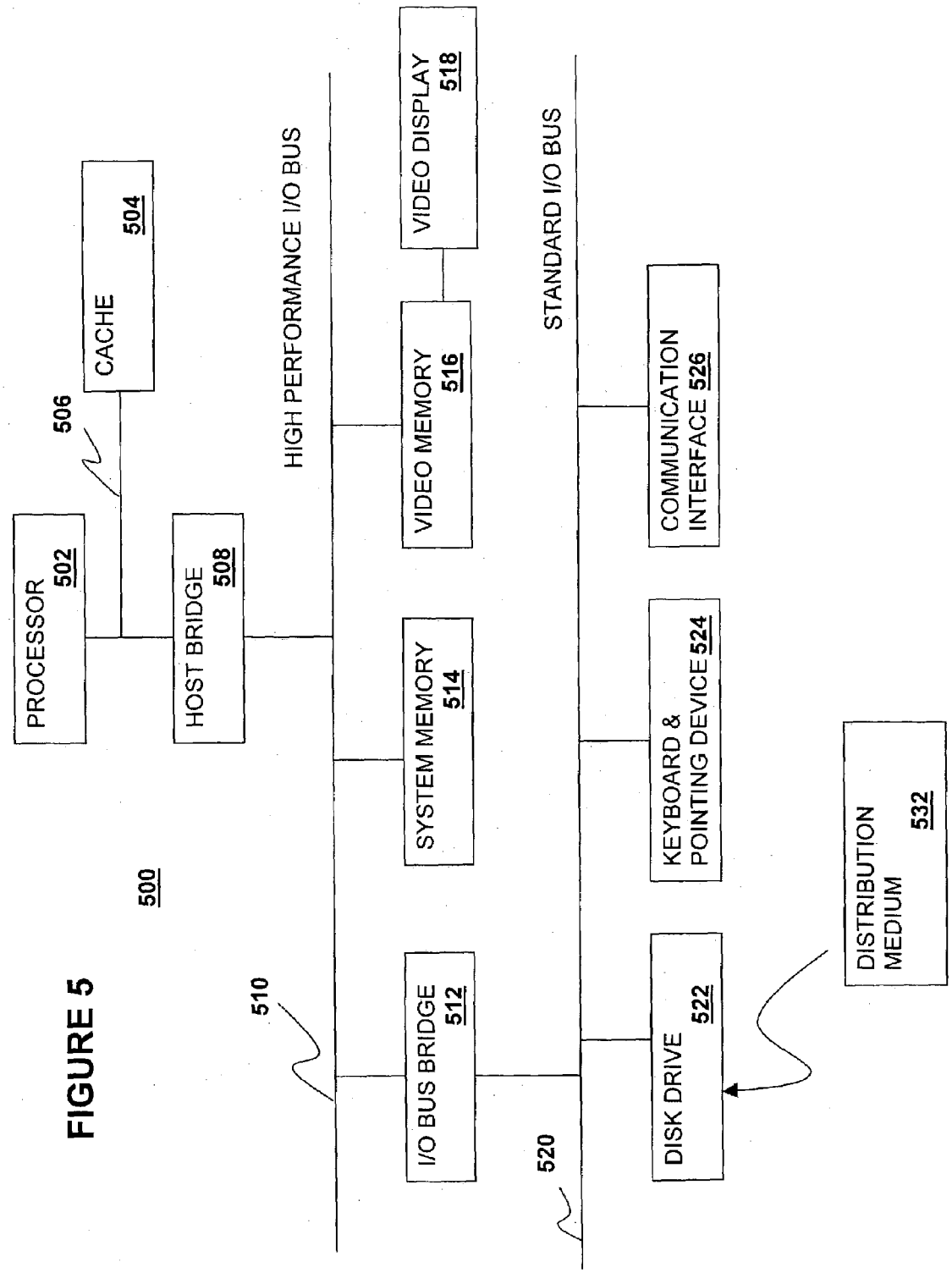
FIG. 5 illustrates one embodiment of a computer system suitable to be programmed with the mechanical design application of the invention.

FIG. 5 illustrates one embodiment of a computer system suitable to be programmed with the mechanical design application of the invention. As shown, for the illustrated embodiment, computer 500 includes processor 502, processor bus 506, high performance I/O bus 510 and standard I/O bus 520. Processor bus 506, and high performance I/O bus 710 are bridged by host bridge 508, whereas I/O buses 510 and 520 are bridged by I/O bus bridge 512. Coupled to processor bus 506 is cache 504. Coupled to high performance I/O bus 510 are system memory 514 and video memory 516, against which video display 518 is coupled. Coupled to standard I/O bus 520 are disk drive 522, keyboard and pointing device 524, and communication interface 526.

These elements perform their conventional functions known in the art. In particular, disk drive 522 and system memory 514 are used to store permanent and working copies of at least the relevant components of the mechanical design system incorporated with the teachings of the invention. The permanent copy may be pre-loaded into disk drive 522 in factory, loaded from distribution medium 532, or down loaded from a remote distribution source (not shown). Distribution medium 532 may be a tape, a CD, and DVD or other storage medium of the like. The constitutions of these elements are known. Any one of number implementations of these elements known in the art may be used to form computer system 500.

In general, those skilled in the art will recognize that the invention is not limited by the details described, instead, the invention can be practiced with modifications and alterations within the spirit and scope of the appended claims. The description is thus to be regarded as illustrative instead of restrictive on the invention.

Thus, an improved way of generating and displaying design change information on a drawing is facilitated, including conveying design change history is disclosed.

What is claimed is:

1. In a computer aided design (CAD) environment, a method of operation comprising:
    receiving an indication of a modification of a design, the design being displayed as part of a drawing within the CAD environment; and
    based at least in part on the received indication, automatically generating and displaying, on the drawing, textual design change information describing revision history of the design.

2. The method of claim 1 further comprising determining a location of the modification of the design on the drawing.

3. The method of claim 2, wherein the location is based at least in part on a horizontal or a vertical location of the drawing.

4. The method of claim 1, wherein automatically generating comprises retrieving various information from a design database.

5. The method of claim 1, wherein receiving an indication comprises receiving an indication of a modification of a CAD entity on the drawing.

6. The method of claim 1, wherein automatically generating comprises automatically generating and displaying design change information within a revision history block on the drawing.

7. The method of claim 1, wherein automatically generating comprises automatically generating and displaying an identifier, the identifier being located in proximity to the modification.

8. The method of claim 1, wherein automatically generating comprises automatically generating and displaying design change information having at least one or more of identifiers in proximity to the modification, location of the modification, description of the modification, date of the modification, and user identification.

9. The method of claim 1, wherein receiving an indication comprises receiving an event notification, and determining that an event associated with the event notification comprises the modification of the design.

10. An apparatus comprising:
    a storage medium having stored therein a plurality of programming instructions, which when executed, the instructions cause the apparatus to receive an indication of a modification of a design, the design being displayed as part of a drawing within a computer aided design (CAD) environment, and based at least in part on the received indication, to automatically generate and display, on the drawing, a data structure including textual design change information describing revision history of the design; and
    a processor coupled to the storage medium to execute the programming instructions.

11. The apparatus of claim 10, wherein the programming instructions, which when executed, further cause the apparatus to determine a location of the modification of the design on the drawing.

12. The apparatus of claim 11, wherein the location is based at least in part on a horizontal or a vertical location of the drawing.

13. The apparatus of claim 10, wherein the programming instructions, which when executed, further cause the apparatus to retrieve various information from a design database.

14. The apparatus of claim 10, wherein the programming instructions, which when executed, further cause the apparatus to receive an indication of a modification of a CAD entity on the drawing.

15. The apparatus of claim 10, wherein the programming instructions, which when executed, further cause the apparatus to automatically generate and display design change information within a revision history block on the drawing.

16. The apparatus of claim 10, wherein the programming instructions, which when executed, further cause the apparatus to automatically generate and display an identifier, the identifier being located in proximity to the modification.

17. The apparatus of claim 10, wherein the programming instructions, which when executed, further cause the apparatus to automatically generate and display design change information having at least one or more of identifiers in proximity to the modification, location of the modification, description of the modification, date of the modification, and user identification.

18. The apparatus of claim 10, wherein the programming instructions, which when executed, further cause the apparatus to receive an event notification, and to determine that an event associated with the event notification comprises the modification of the design.

19. The apparatus of claim 10, wherein the data structure is a data table.

20. An article of manufacture having stored therein a plurality of programming instructions, which when executed, the instructions cause a machine to receive an indication of a modification of a design, the design being displayed as part of a drawing within a computer aided design (CAD) environment, and based at least in part on the received indication, to automatically generate and display, on the drawing, a data structure including textual design change information describing revision history of the design.

21. The article of manufacture of claim 20, wherein said programming instructions, which when executed, further cause the machine to determine a location of the modification of the design on the drawing.

22. The article of manufacture of claim 21, wherein the location is based at least in part on a horizontal or a vertical location of the drawing.

23. The article of manufacture of claim 20, wherein said programming instructions, which when executed, further cause the machine to retrieve various information from a design database.

24. The article of manufacture of claim 20, wherein said programming instructions, which when executed, further cause the machine to receive an indication of a modification of a CAD entity on the drawing.

25. The article of manufacture of claim 20, wherein said programming instructions, which when executed, further cause the machine to automatically generate and display design change information within a revision history block on the drawing.

26. The article of manufacture of claim 20, wherein said programming instructions, which when executed, further cause the machine to automatically generate and display an identifier, the identifier being located in proximity to the modification.

27. The article of manufacture of claim 20, wherein said programming instructions, which when executed, further cause the machine to automatically generate and display design change information having at least one or more of identifiers in proximity to the modification, location of the modification, description of the modification, date of the modification, and user identification.

28. The article of manufacture of claim 20, wherein said programming instructions, which when executed, further cause the machine to receive an event notification, and to determine that an event associated with the event notification comprises the modification of the design.

29. The article of manufacture of claim 20, wherein the data structure is a data table.

* * * * *